United States Patent
Mos et al.

(10) Patent No.: US 8,887,107 B2
(45) Date of Patent: Nov. 11, 2014

(54) INSPECTION METHOD AND APPARATUS AND LITHOGRAPHIC PROCESSING CELL

(71) Applicant: ASML Netherlands B.V., Veldhoven (NL)

(72) Inventors: Everhardus Cornelis Mos, Best (NL); Hubertus Johannes Gertrudus Simons, Venlo (NL); Peter Ten Berge, Eindhoven (NL); Nicole Schoumans, 's-Hertogenbosch (NL); Michael Kubis, Düsseldorf (DE); Paul Cornelis Hubertus Aben, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/963,947

(22) Filed: Aug. 9, 2013

(65) Prior Publication Data

US 2014/0089870 A1 Mar. 27, 2014

Related U.S. Application Data

(60) Provisional application No. 61/697,486, filed on Sep. 6, 2012.

(51) Int. Cl.
*G06F 17/50* (2006.01)
*G03F 1/36* (2012.01)

(52) U.S. Cl.
CPC .............. *G06F 17/5081* (2013.01); *G03F 1/36* (2013.01)
USPC .................. 716/54; 716/50; 716/51; 716/52; 716/53; 716/55

(58) Field of Classification Search
CPC ........... G03F 7/705; G03F 1/144; G03F 1/36; G03F 7/70666; G03F 7/70675; G03F 1/14; G03F 7/70125; G03F 7/70425; G03F 7/70091
USPC .......................................... 716/51, 52, 53, 54
See application file for complete search history.

(56) References Cited

U.S. PATENT DOCUMENTS

| 6,716,646 B1 | 4/2004 | Wright et al. |
| 7,544,449 B1 * | 6/2009 | Smith et al. ..................... 430/30 |

(Continued)

FOREIGN PATENT DOCUMENTS

| DE | 102 14 247 A1 | 10/2003 |
| EP | 1 628 164 A2 | 2/2006 |

OTHER PUBLICATIONS

English-Language Abstract for German Patent Publication No. 102 14 247 A1, published Oct. 23, 2003; 1 page.

(Continued)

*Primary Examiner* — Vuthe Siek
*Assistant Examiner* — Brian Ngo
(74) *Attorney, Agent, or Firm* — Sterne, Kessler, Goldstein & Fox P.L.L.C.

(57) ABSTRACT

A method of calculating process corrections for a lithographic tool, and associated apparatuses. The method comprises measuring process defect data on a substrate that has been previously exposed using the lithographic tool; fitting a process signature model to the measured process defect data, so as to obtain a model of the process signature for the lithographic tool; and using the process signature model to calculate the process corrections for the lithographic tool.

18 Claims, 5 Drawing Sheets

(56) References Cited

U.S. PATENT DOCUMENTS

| | | | |
|---|---|---|---|
| 7,685,556 B2* | 3/2010 | Fukuhara et al. | 716/54 |
| 7,926,004 B2* | 4/2011 | Pierrat et al. | 716/50 |
| 7,972,483 B2 | 7/2011 | Donohue et al. | |
| 2004/0189964 A1* | 9/2004 | Nijmeijer et al. | 355/55 |
| 2005/0118812 A1 | 6/2005 | Donohue et al. | |
| 2006/0266243 A1* | 11/2006 | Percin et al. | 101/484 |
| 2007/0050749 A1* | 3/2007 | Ye et al. | 716/20 |
| 2008/0088832 A1* | 4/2008 | Cramer et al. | 356/237.4 |
| 2010/0125823 A1* | 5/2010 | Renwick et al. | 716/21 |
| 2010/0218160 A1* | 8/2010 | Huang et al. | 716/20 |
| 2012/0047471 A1* | 2/2012 | Bagheri et al. | 716/51 |
| 2012/0052418 A1* | 3/2012 | Tian et al. | 430/5 |
| 2012/0089365 A1 | 4/2012 | Fay et al. | |
| 2012/0177282 A1 | 7/2012 | Chen et al. | |

OTHER PUBLICATIONS

Chiu, C.-F., et al., "Impacts of Overlay Correction Model and Sampling Scheme on Device Yield," Proceedings of the SPIE—Metrology, Inspection, and Process Control for Microlithography XVI, vol. 8324, 2012; pp. 83241S-1 to 83241S-7.

* cited by examiner

INSPECTION METHOD AND APPARATUS AND LITHOGRAPHIC PROCESSING CELL

CROSS REFERENCE TO RELATED APPLICATIONS

This application is related to U.S. Provisional App. No. 61/697,486, which is incorporated by reference herein in its entirety.

FIELD

The present invention relates to methods of inspection usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Semiconductor processing equipment (e.g., lithography, etch, bake, polish and anneal) can introduce a fingerprint which characterizes the tool's imperfections. Such imperfections result in process distortions which can cause overlay errors. It is normal to characterize the process fingerprints directly in terms of correctable parameters of the lithographic process tool. However this is an inefficient solution.

It would be desirable to provide a more efficient parameterization of a process fingerprint for use in performing process corrections.

SUMMARY

According to an aspect of the invention, there is provided The method of calculating process corrections for a lithographic tool comprising: measuring process data on a substrate that has been previously exposed using the lithographic tool; fitting a process signature model to the measured process data, so as to obtain a model of the process signature for the lithographic tool; and using the process signature model to calculate the process corrections for the lithographic tool.

According to a second aspect of the present invention, there is provided an inspection apparatus comprising: a projection system configured to project a radiation beam onto a substrate that has been previously exposed using the lithographic tool; a detector configured to detect second radiation having interacted with the substrate; and a processor configured to: measure process data from the detected second radiation; fit a process signature model to the measured process data, so as to obtain a model of the process signature for the lithographic tool; and use the process signature model to calculate process corrections for the lithographic tool.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
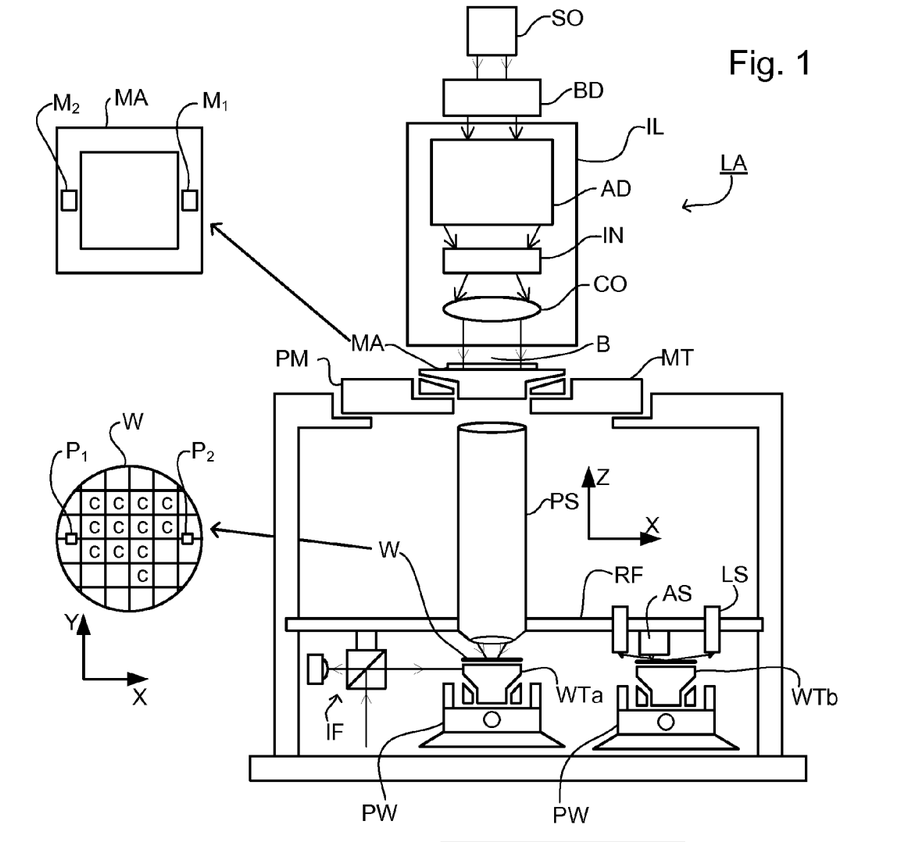
FIG. 1 depicts a lithographic apparatus.

FIG. 1 schematically shows a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask libraty, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
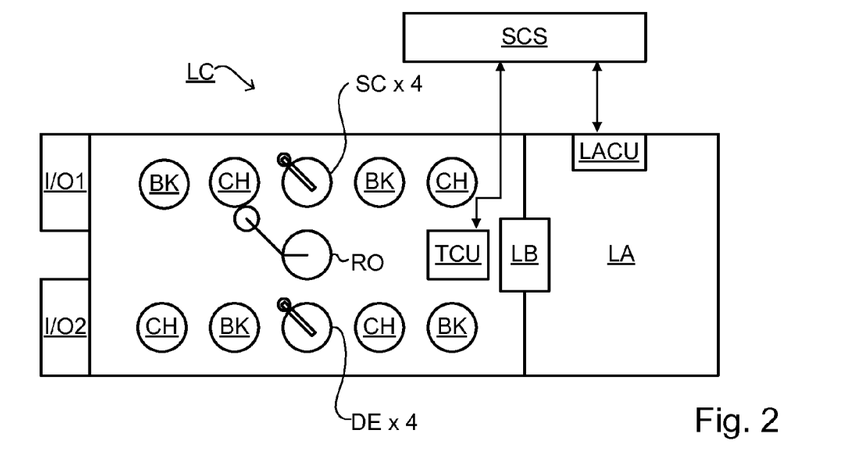
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
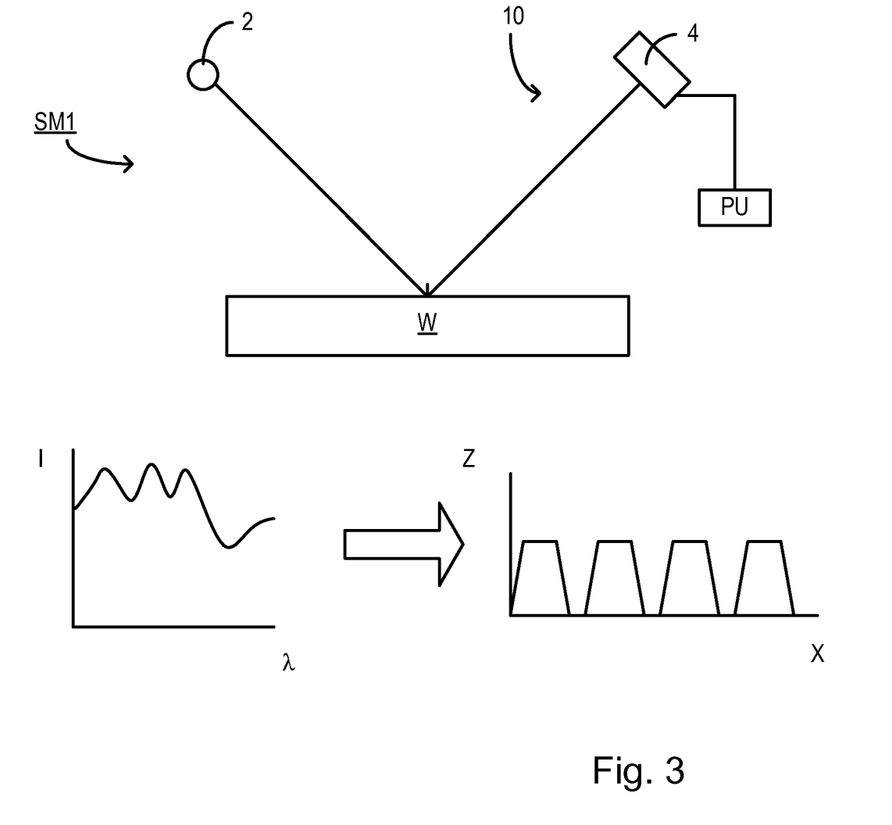
FIG. 3 depicts a first scatterometer.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
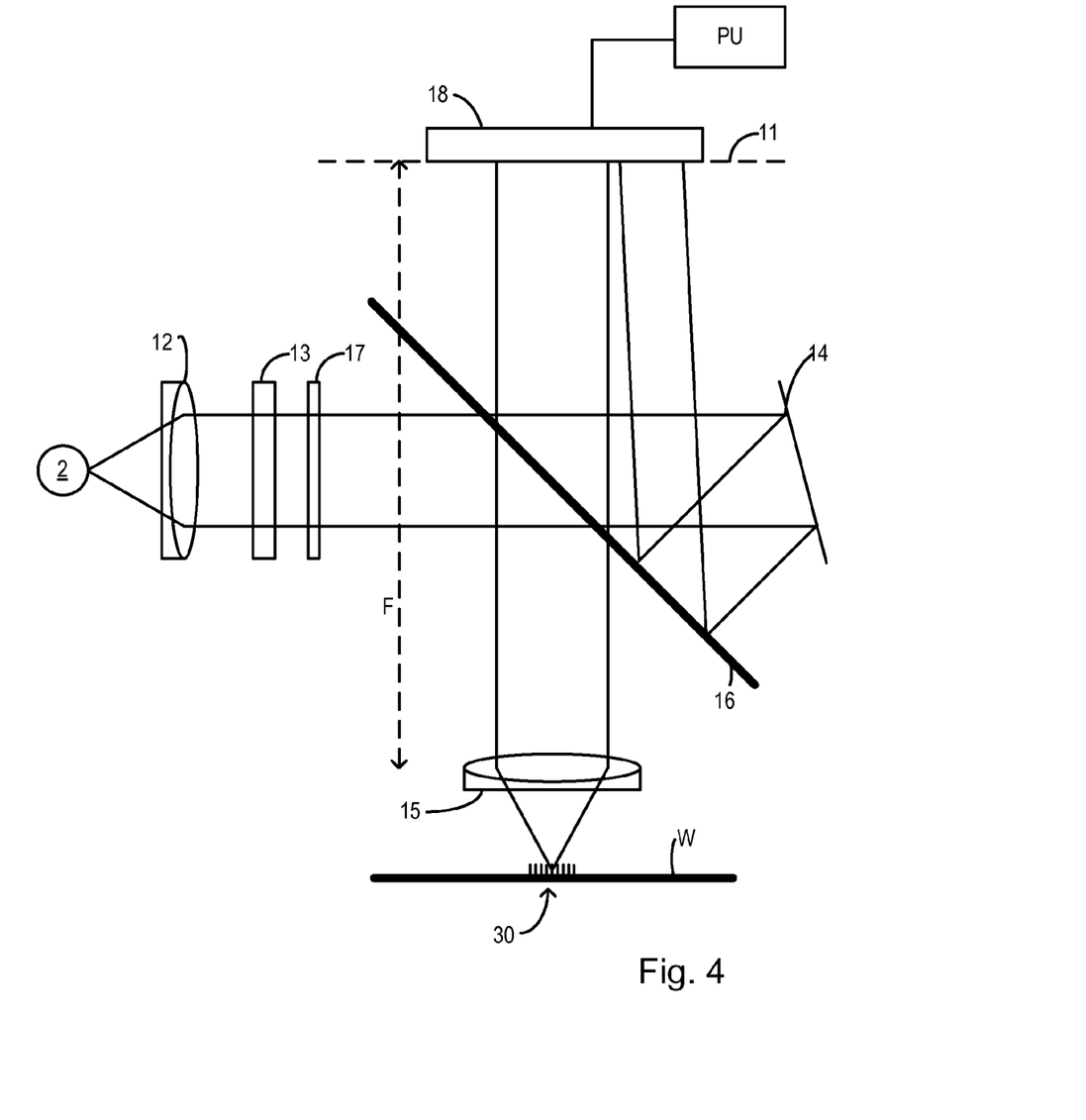
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PS, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2D grating, such as pillar or via widths or lengths or shapes, may be input to the reconstruction process, performed by processing unit PU, from knowledge of the printing step and/or other scatterometry processes.

Semiconductor processing tools, such as lithographic tools, can introduce variations that can lead to a process fingerprint, which characterizes the tool's imperfections. Such imperfections result in process distortions which cause (for example) overlay errors. Current correction methods for correction of process fingerprints (such as overlay fingerprints) in lithographic processing commonly characterize the process fingerprints directly in terms of correctable parameters of the lithographic process tool. One example is the corrections per exposure (CPE) technique which applies intra-field corrections per exposure. In this technique, correctable parameters are measured on a processed wafer for each exposed field. These measured parameters are than used to correct the fingerprint by applying appropriate corrections for each exposed field in subsequent lots.

A drawback of such methods of directly fitting correctable parameters to fingerprint measurements is that it is highly inefficient. The number of measurements required for correction is not a function of the fingerprint characteristics, but of the correction capabilities of the lithographic process tool. Until recently, the number of correctable parameters was relatively few, so this was not a significant problem. Current tools have much greater correction capabilities, and therefore a fingerprint defined in terms of correctable parameters has become unwieldy and requires a large number of measurements to obtain.

A further drawback is that averaging out of noise (i.e., process noise and measurement noise) is not optimized. This is because the number of parameters that are derived from the measurements is only limited by the degrees of freedom of the lithographic process tool. In general the amount of information (or spatial resolution) of a process fingerprint is smaller than this number and therefore noise reduction potential is lost.

For the existing methods a (theoretical) noise reduction of about $\sqrt{(N\_meas N\_corr)}$ can be achieved, with N_meas equalling the number of measured points and N_corr the number of degrees of freedom for correction. Note that with corrections per exposure, N_meas and N_corr should be taken per field.

Figure 5:
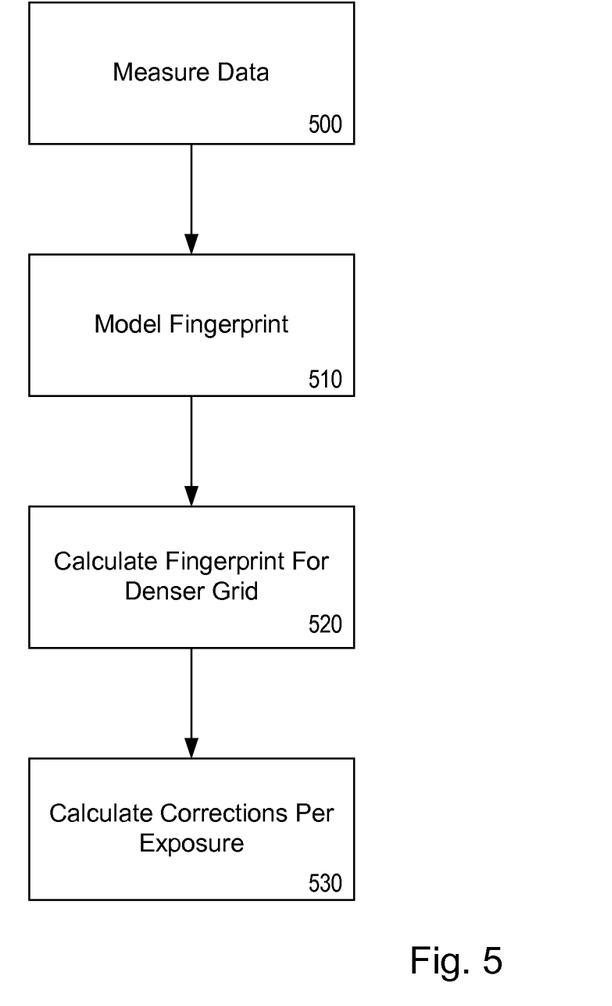
FIG. 5 is a flow diagram showing a method according to an embodiment of the invention.

FIG. 5 is a flow diagram illustrating an improved method which aims to address these issues. In a first step 500, measurements are performed on a wafer, the measurements comprising the amount that a certain parameter (for example, overlay) deviates from the ideal (zero overlay) at a number of measurement positions. The number of measurements made may be significantly fewer than the number required to perform current CPE techniques.

In an estimation step 510, a fingerprint model is used to fit the measured (overlay) data so as to describe this deviation from the ideal. This step is performed in a robust manner using a minimal number of parameters sufficient to characterize the deviations. The root cause of these deviations may be the processing of the wafer outside the lithographic tool, the lithographic tool itself or a combination of both.

In one embodiment, the fingerprint model uses a Zernike function of radial and tangential overlay components. Zernike models fit better to the fingerprint characteristics of wafer process tools because a typical geometry of such tools is circular symmetric. For the same reason, describing overlay in radial and tangential (i.e., perpendicular to radial direction) components (as opposed to X and Y components) may provide a better fit. Other models that can be used to characterize a process fingerprint are Radial Basis Functions, Fourier series and polynomial series (e.g., Legendre). For typical process equipment fingerprints, additional parameters such as scan direction, scan velocity or expose sequence can be incorporated in the model in addition to r, theta or X, Y.

In a next step 520, noise reduced measurements may be calculated for any location on the wafer, therefore decoupling the model from the measurement locations. The result of this is a fingerprint calculated for a dense grid. In this step it is possible to take into account the die layout. For example the grid may be calculated for only complete (and therefore potentially yielding) dies on the wafer.

In a final optimization step 530, the fingerprint model is used to calculate the necessary corrections per exposure. All degrees of freedom of a lithographic process tool can be used in this optimization step because the fingerprint model can be used to estimate required correction values for any location on the wafer. For example, the number of parameters may number over 6 or over 10, per exposed field. In one specific embodiment, 15 parameters per field are used. Estimation of the correction values can be done by using interpolation and extrapolation of the estimated fingerprint model.

For the proposed method the theoretical noise reduction is about $\sqrt{(N\_meas N\_fngr)}$, with N_fngr the number of parameters required to characterize the fingerprint. N_fingr is, in general, much smaller than the number of degrees of freedom for correction, N_corr. Hence the noise reduction of the proposed method, when using an equal number of measurements, will be greater in comparison to the existing CPE method described above. Perhaps more importantly (as it is particularly desirable to reduce the number of measurements), the theoretical noise reduction of the proposed method will be similar to that of the existing CPE method, although using fewer measurements.

Figure 6:
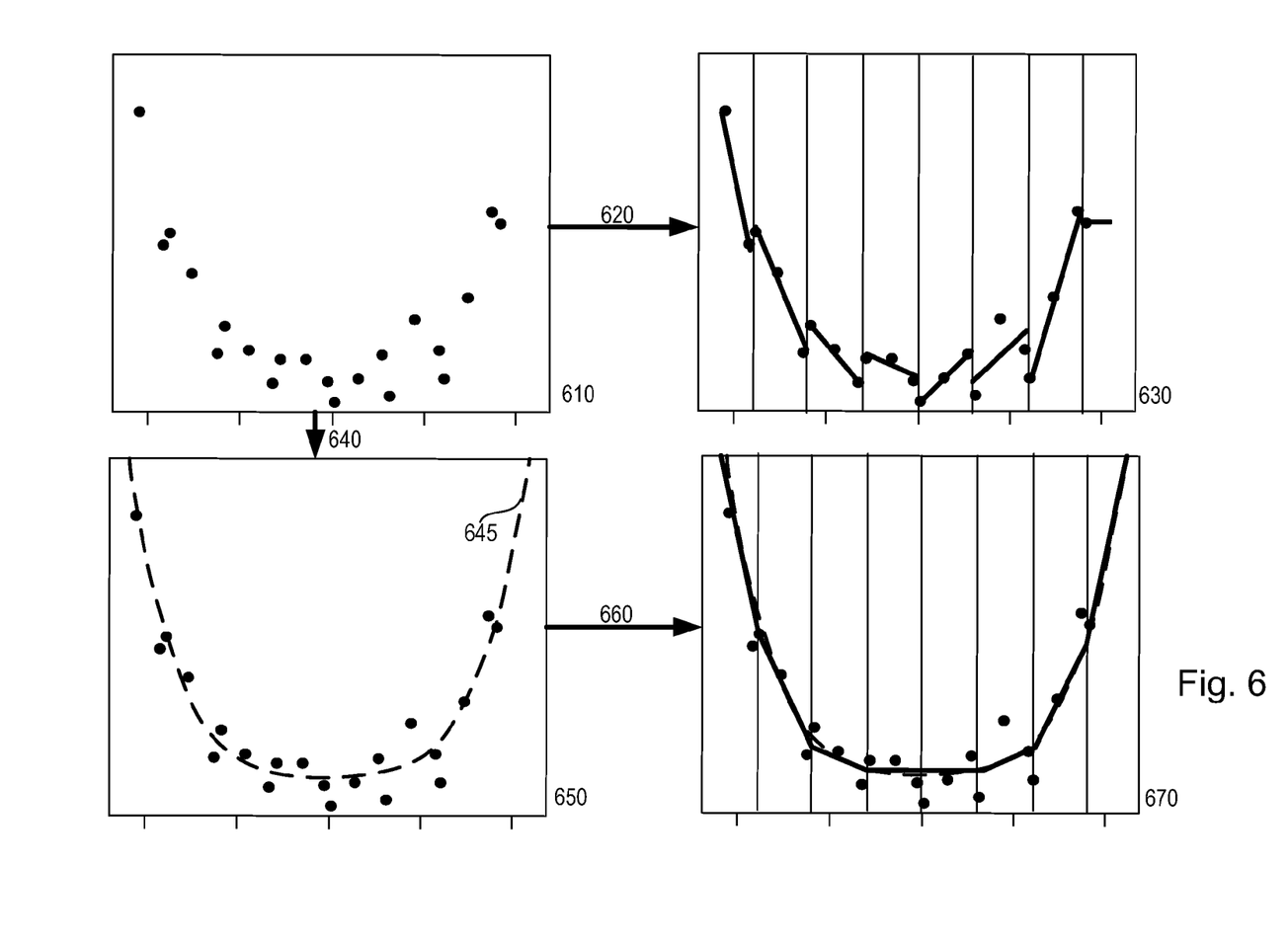
FIG. 6 show graphically the steps of a method according to an embodiment of the invention, and a prior method.

FIG. 6 illustrates how the methods disclosed herein result in more accurate, less noisy fingerprint corrections. Graph 610 shows a (relatively small compared with current CPE techniques) number of measurements taken from a wafer. Arrow 620 indicates the performing of the current direct CPE method. Graph 630 is the result of this direct CPE method, It can be seen that, as there is little data, only offsets per field can he calculated with virtually no noise reduction. Arrow 640 indicates the performing of the fingerprint estimation step (step 510 in FIG. 5 above), and graph 650 shows an estimated fingerprint 645 fitted to the measurement data. Arrow 660 represents the performing of steps 520 and 530 of FIG. 5. As can be seen from the resultant, graph 670, when compared to graph 630, interpolation and extrapolation from the data using the fingerprint 645 has resulted in more accurate perm field corrections. It can therefore be seen that, for the same number of measurements, the direct CPE is less robust compared to the methods disclosed herein. Alternatively, to obtain the same robustness, direct CPE requires the performance of many more measurements compared to the methods disclosed herein.

The methods described herein may be performed using a full measurement layout of 1234 points per wafer and will show some improvement in the noise averaging characteristics. However, where a reduced measurement layout is used (for example 180 points per wafer), considerably better noise averaging characteristics can be obtained, compared to other methods using the same reduced measurement layout. Measuring 180 points per wafer for four wafers can be done with existing integrated metrology tools. This means that the proposed method enables the use of such tools to control fingerprints based on measurement data from each lot.

The proposed method further enables the use of 15 parameter corrections per field with a reduced layout: the current CPE method would require at least 15 measurements per field. With only 180 measured points per wafer this is not possible.

The proposed method allows the determination of (CPE) corrections based on fewer measurements than in the state-of-the-art method. This allows the application of integrated metrology techniques. It also makes it possible to update the correction set after each lot (reducing lot-to-lot variations), and furthermore to perform measurements on more wafers per lot (reducing wafer-to-wafer variations). Through these reductions of lot-to-lot and wafer-to-wafer variations, this proposed method enables improvement of fabrication performance by increasing a process control parameter $c_{pk}$ of a specific layer/process.

The method results in more meaningful key performance indicators of the process fingerprint and the scanner fingerprint separately. It also enables a more comprehensible way of using moving average filters i.e., on the parameter values of the estimated fingerprints. With orthogonal fingerprint models (such as Zernike) a moving average filter will be more robust.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of calculating a process correction for a lithographic tool comprising:
   measuring process data on a substrate that has been previously exposed using the lithographic tool;
   fitting, by a processing unit, a process signature model to the measured process data, so as to obtain a fitted process signature model for the lithographic tool; and
   calculating, by the processing unit directly after the fitting, the process correction for the lithographic tool for any location on the substrate based on the fitted process signature model using all possible relevant degrees of freedom of the lithographic tool.

2. The method of claim 1 wherein the process data comprises data describing a deviation from ideal of a position of a layer relative to a preceding layer.

3. The method of claim 2 wherein the process signature model is a Zernike function comprising radial and tangential overlay components.

4. The method of claim 1 further comprising applying the calculated process correction for each exposed field in a subsequent exposure using the lithographic tool.

5. The method of claim 4, further comprising:
   repeating the measuring, fitting, calculating, and applying prior to exposure of each substrate lot to obtain an updated process correction.

6. The method of claim 1 wherein the process signature model comprises over ten parameters.

7. The method of claim 1 wherein the calculating further comprises interpolating and extrapolating the fitted process signature model to determine the process correction.

8. The method of claim 1 wherein the measuring comprises performing fewer than 500 measurements on the substrate.

9. The method of claim 8 wherein the measuring comprises performing fewer than 200 measurements on the substrate.

10. An inspection apparatus comprising:
    a projection system configured to project a radiation beam onto a substrate that has been previously exposed using a lithographic tool;
    a detector configured to detect scattered radiation having interacted with the substrate; and
    a processor configured to:
    measure process data from the detected scattered radiation;
    fit a process signature model to the measured process data, so as to obtain a fitted process signature model for the lithographic tool; and
    calculate, directly after fitting the process signature model, a process correction for the lithographic tool for any location on the substrate based on the fitted process signature model using all possible relevant degrees of freedom of the lithographic too.

11. The inspection apparatus of claim 10 wherein the process data comprises data describing a deviation from ideal of a position of a layer relative to a preceding layer.

12. The inspection apparatus of claim 11 wherein the process signature model is a Zernike function comprising radial and tangential overlay components.

13. The inspection apparatus of claim 10 wherein the process signature model comprises over ten parameters.

14. The inspection apparatus of claim 10 wherein the processor uses all possible relevant degrees of freedom of the inspection apparatus to calculate the process correction.

15. The inspection apparatus of claim 10 wherein the processor calculates the process correction using interpolation and extrapolation of the fitted process signature model.

16. The inspection apparatus of claim 10, wherein the processor is further configured to calculate the process correction directly after obtaining the fitted process signature model.

17. An apparatus comprising:
a projection system configured to project a radiation beam onto an exposed substrate;
a detector configured to detect the radiation beam after reflection from the substrate; and
a processor configured to:
measure process data from the reflected radiation beam;
fit a process signature model to the measured process data to obtain a fitted process signature model for a lithographic tool used to expose the substrate; and
calculate, directly after fitting the process signature model, a process correction for the lithographic tool for any location on the substrate based on the fitted process signature model using all possible relevant degrees of freedom of the lithographic tool.

18. The apparatus of claim 17, wherein:
the radiation beam comprises a plurality of radiation beams,
the detector is configured to detect the plurality of radiation beams after reflection from the substrate as a plurality of measurements,
the process correction comprises a plurality of process corrections per field of the substrate, and
the process signature model comprises a plurality parameters, the plurality of measurements being, less than the plurality of process corrections.

* * * * *

UNITED STATES PATENT AND TRADEMARK OFFICE
CERTIFICATE OF CORRECTION

PATENT NO. : 8,887,107 B2  
APPLICATION NO. : 13/963947  
DATED : November 11, 2014  
INVENTOR(S) : Mos et al.

Page 1 of 1

It is certified that error appears in the above-identified patent and that said Letters Patent is hereby corrected as shown below:

In the Claims

In column 14, line 19, claim 18, after "being", please delete ",".

Signed and Sealed this
Twelfth Day of May, 2015

Michelle K. Lee
*Director of the United States Patent and Trademark Office*